United States Patent [19]

Koertge

[11] Patent Number: 5,333,169

[45] Date of Patent: Jul. 26, 1994

[54] CIRCUIT ARRANGEMENT FOR MEASURING THE X-RAY TUBE CURRENT

[75] Inventor: Detlef Koertge, Nuremberg, Fed. Rep. of Germany

[73] Assignee: Siemens Aktiengesellschaft, Munich, Fed. Rep. of Germany

[21] Appl. No.: 84,144

[22] Filed: Jul. 1, 1993

[30] Foreign Application Priority Data

Aug. 10, 1992 [DE] Fed. Rep. of Germany ....... 4226442

[51] Int. Cl.$^5$ .............................................. H05G 1/20
[52] U.S. Cl. ..................................... 378/109; 378/110; 378/101
[58] Field of Search ................ 378/108, 109, 110, 111, 378/112, 207, 101; 363/81

[56] References Cited

U.S. PATENT DOCUMENTS 4,670,893  6/1987  Tsuchiya ............................ 378/110
5,200,984  4/1993  Laeuffer ............................ 378/110

*Primary Examiner*—David P. Porta
*Assistant Examiner*—Don Wong
*Attorney, Agent, or Firm*—Hill, Steadman & Simpson

[57] ABSTRACT

A circuit arrangement for accurately measuring the x-ray tube current substantially eliminates measurement errors by taking the displacement current caused by the capacitance of the high-voltage cable into account in the measurement. A test voltage is taken across a precision resistor. Another voltage is tapped at a location which includes the high-voltage cable capacitance and is supplied to a status monitor which differentiates this voltage and generates a voltage signal which is superimposed on the test voltage for forming a current signal which accurately represents the x-ray tube current.

1 Claim, 1 Drawing Sheet

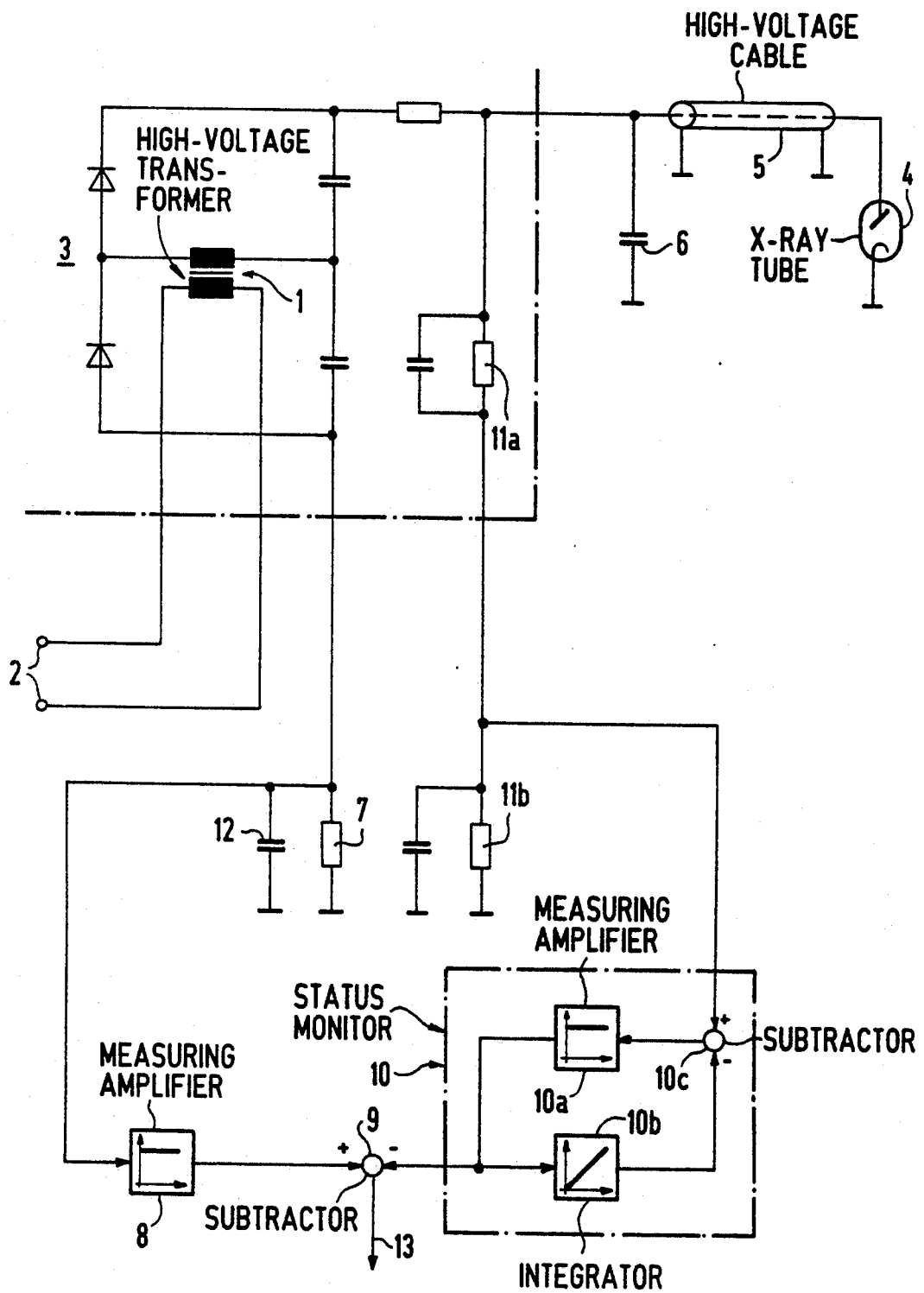

CIRCUIT ARRANGEMENT FOR MEASURING THE X-RAY TUBE CURRENT

BACKGROUND OF THE INVENTION

1. Field of the Invention

The present invention is directed to a circuit arrangement for measuring the current flowing between the anode and the filament in an x-ray tube.

2. Description of the Prior Art

In x-ray technology, the actual value of the x-ray tube current during the transillumination or exposure mode must be acquired for control purposes and must be converted into a corresponding voltage. For this purpose, it is known to connect a precision resistor in series with the high-voltage generator, at which the current signal is tapped. Due to the propagation constants per unit length of the high-voltage cable, signal parts that represent a dynamic (changing) falsification of the current signal are superimposed on this current signal given a change of the x-ray tube voltage. This effect occurs particularly when switching the x-ray tube on, since the x-ray tube voltage at that time is adjusted with its greatest rate of change, from zero to a prescribed nominal value. During the adjustment event of the x-ray tube voltage, a value of current is measured that lies clearly above the actual value. The reason for this dynamic superelevation of the value of the current is essentially the capacitance of the coaxial high-voltage cable, since a displacement current that cannot be left out of consideration flows into the cable capacitance given a high rate of change of the x-ray tube voltage.

German OS 34 47 490, corresponding to U.S. Pat. No. 4,670,893, discloses an arrangement wherein both the current acquired by a current detector and the voltage acquired by a voltage detector are processed in common in an x-ray tube. The problem of signal falsifications given changes of the x-ray tube voltage, however, still occurs.

SUMMARY OF THE INVENTION

It is an object of the present invention to provide a circuit arrangement for forming a current signal that accurately corresponds to the current through the x-ray tube, whereby signal falsifications given changes, particularly when switching the x-ray tube voltage on, are avoided.

The above object is achieved in accordance with the principles of the present invention in a circuit arrangement wherein a test voltage is taken across a precision resistor. Another voltage is tapped at a location which includes the capacitance of the high-voltage cable, and is supplied to a status monitor. Within the status monitor, the further voltage is differentiated, and a status monitor output signal is generated which is dependent on the differentiated signal. The status monitor output signal is superimposed on the test voltage for forming a current signal which accurately represents the x-ray tube current.

In the circuit arrangement of the invention, mismeasurements are substantially eliminated not only when switching the x-ray tube on, but also given the occurrence of control events for the x-ray tube voltage during operation. Thus, mismeasurements of the mAs value which important for the exposure, are also substantially eliminated.

DESCRIPTION OF THE DRAWINGS

The single FIGURE is a schematic circuit diagram of a circuit arrangement for measuring the current in an x-ray tube, constructed in accordance with the principles of the present invention.

DESCRIPTION OF THE PREFERRED EMBODIMENTS

Only those parts of an x-ray generator necessary for explaining the invention are shown in the drawing. The x-ray generator contains a high-voltage transformer 1, supplied at its inputs 2 by an inverse rectifier (not shown), and which supplies an x-ray tube 4 via a rectifier circuit 3. The feed of the x-ray tube 4 ensues via a high-voltage cable 5 that has a capacitance that is represented in the drawing as cable capacitance 6.

In order to form a current signal accurately corresponding to the x-ray tube current, a precision resistor 7 is provided, which is traversed by the x-ray tube current and by the displacement current of the high-voltage cable 5. A voltage signal corresponding to the voltage that is actually supplied from the high-voltage rectifier 1 is formed by a measuring amplifier 8 and is supplied to a subtractor 9. The subtractor 9 receives a voltage from a status monitor 10 that is tapped at the cable capacitance 6, and which thus corresponds to the change of the x-ray tube voltage.

The status monitor 10 generates a signal corresponding to the displacement current caused by the cable capacitance 6. For this purpose, the voltage at the cable capacitance 6 is identified via a frequency-compensated voltage divider formed by resistors 11a and 11b and is supplied to a measuring amplifier 10a in the status monitor 10. The current in the cable capacitance 6 can thus be calculated in a integrator 10b as a time derivative of the voltage at the cable capacitance 6, which is then subtracted from the tapped signal in a subtractor 10c.

A capacitance 12 is connected in parallel with the precision resistor 7 to compensate for the measurement error that arises because the technical realization of an ideal differentiator is not possible in the as status monitor 10. The time constant of the RC elements 7 and 12 is identical to the delay of the non-ideal differentiator 10. By subtracting the signal of the status monitor 10 from the signal of the measuring amplifier 8, a current signal that corresponds to the true x-ray tube current is achieved at the output 13 of the subtractor 9.

Although modifications and changes may be suggested by those skilled in the art, it is the intention of the inventor to embody within the patent warranted hereon all changes and modifications as reasonably and properly come within the scope of his contribution to the art.

I claim as my invention:

1. A circuit arrangement for accurately calculating the current flowing in an x-ray tube comprising:
   high-voltage supply means for supplying voltage to an x-ray tube via a high-voltage cable, said high-voltage cable having a capacitance associated therewith;
   means for generating a test signal corresponding to the voltage supplied to said x-ray tube by said means for supplying high voltage;
   means for generating a further voltage signal taken at a location including said capacitance of said high-voltage cable;
   status monitor means, to which said further voltage signal is supplied, including means for differentiating said further voltage signal and for generating a status monitor means output incorporating the differentiated further voltage signal; and
   means for subtracting said status monitor means output from said test signal for obtaining a signal accurately corresponding to the x-ray tube current.

* * * * *